United States Patent
Sakai et al.

(10) Patent No.: US 7,013,557 B2
(45) Date of Patent: Mar. 21, 2006

(54) METHOD OF PACKAGING ELECTRONIC COMPONENTS WITHOUT CREATING UNNECESSARY SOLDER BALLS

(75) Inventors: Hiroshi Sakai, Tokyo (JP); Motoji Suzuki, Tokyo (JP); Makoto Igarashi, Niigata (JP); Akihiro Tanaka, Niigata (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/157,012

(22) Filed: May 30, 2002

(65) Prior Publication Data

US 2002/0179322 A1 Dec. 5, 2002

(30) Foreign Application Priority Data

Jun. 1, 2001 (JP) .............................. 2001-166908

(51) Int. Cl.
*H05K 3/30* (2006.01)

(52) U.S. Cl. ............................. 29/832; 29/839; 29/840; 29/842; 228/180.21; 438/106; 257/734

(58) Field of Classification Search ................. 29/832, 29/840, 843, 842, 839; 101/127; 228/180.22, 228/180.21, 257; 438/687, 612, 613, 678, 438/108; 257/722, 753; 361/707, 700
See application file for complete search history.

(56) References Cited

U.S. PATENT DOCUMENTS

| | | | |
|---|---|---|---|
| 4,953,460 A * | 9/1990 | Wojcik | 29/840 |
| 5,316,788 A * | 5/1994 | Dibble et al. | 430/314 |
| 5,390,080 A * | 2/1995 | Melton et al. | 361/765 |
| 5,400,953 A | 3/1995 | Maeno | |
| 5,569,964 A * | 10/1996 | Ikebe | 257/780 |
| 5,593,080 A * | 1/1997 | Teshima et al. | 29/840 |
| 6,012,231 A * | 1/2000 | Regner et al. | 33/562 |
| 6,416,590 B1 | 7/2002 | Hirata et al. | |
| 6,684,496 B1 * | 2/2004 | Glenn | 29/841 |
| 2002/0179322 A1 * | 12/2002 | Sakai et al. | 174/255 |
| 2002/0185304 A1 * | 12/2002 | Sakai et al. | 174/257 |

FOREIGN PATENT DOCUMENTS

| | | |
|---|---|---|
| EP | 08046337 | 2/1996 |
| EP | 10321997 | 4/1998 |
| EP | 2001068841 | 3/2001 |
| JP | 07-273441 | 10/1995 |
| JP | 08-078832 | 3/1996 |
| JP | 09-327980 | 12/1997 |

(Continued)

OTHER PUBLICATIONS

Vincent J. H. et al: "Lead-Free Solders for Electronic Assembly" GEC Journal of Research, GEC Marconi Research Center. Great Baddow Chemsford, GB vol. 11, No. 2, 1994, pp. 76-89, XP000454473.

(Continued)

*Primary Examiner*—Minh Trinh
(74) *Attorney, Agent, or Firm*—Foley & Lardner LLP

(57) ABSTRACT

A method of packaging an electronic component having electrodes soldered on lands on a printed circuit board uses a mask pattern that corresponds to the lands onto which solder paste is deposited. Solder paste is printed on the lands using the mask which has a convex shape such that the edges of the solder paste lie inside the edges of the lands. The electrodes are then placed on the solder paste, and the solder paste is caused to reflow to solder the electrodes to the lands.

4 Claims, 3 Drawing Sheets

FOREIGN PATENT DOCUMENTS

| | | |
|---|---|---|
| JP | 10-098074 | 4/1998 |
| JP | 2000-158179 | 6/2000 |
| JP | 2000-317682 | 11/2000 |
| WO | WO 01/97580 A1 | 12/2001 |

OTHER PUBLICATIONS

"SMT Solder Joint Acceptability Criteria" Assembly, Hitchcock Publishing, Carol Stream, US, vol.33, No. 7, Jul. 1, 1990, pp. 174-183, XP000179099.

* cited by examiner

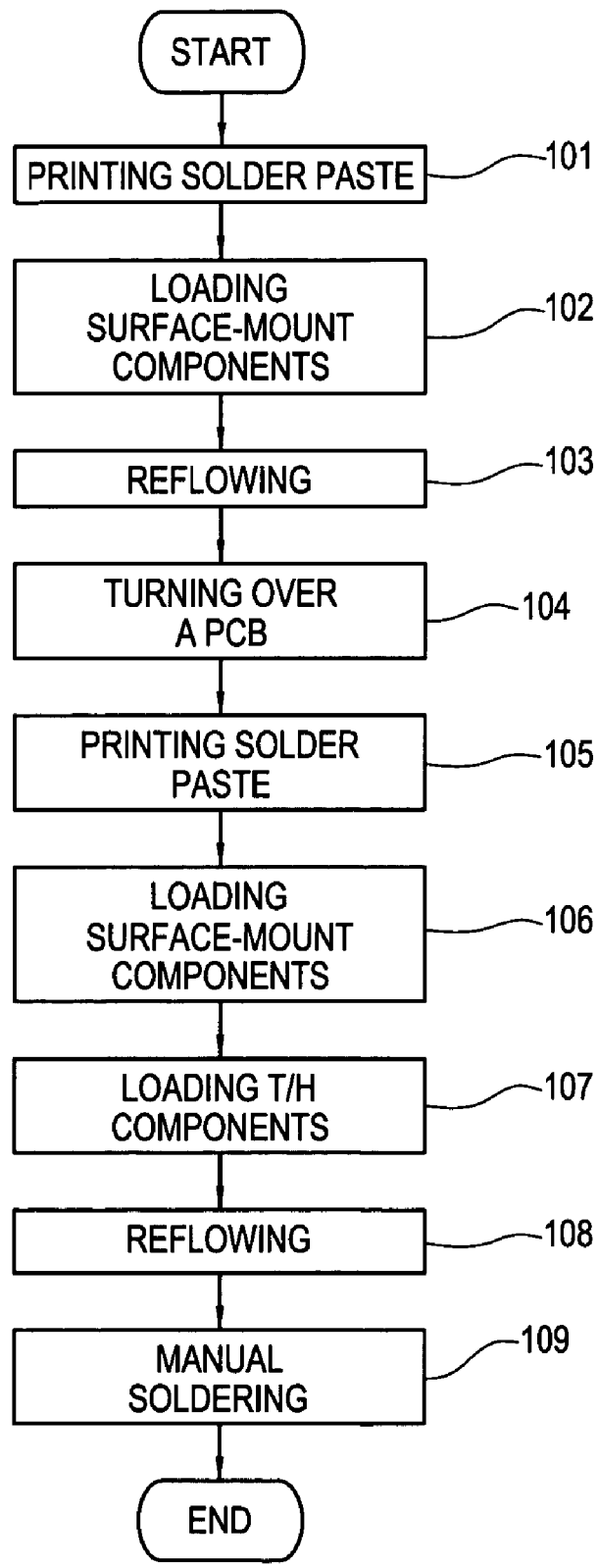

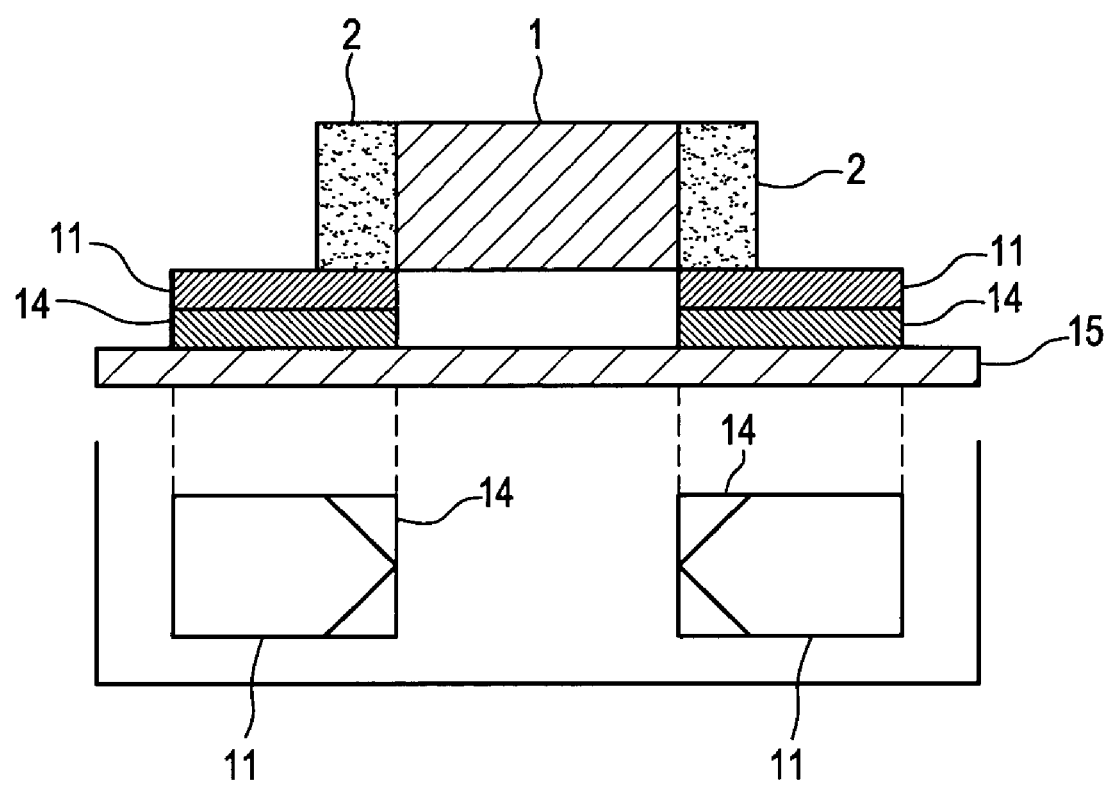

METHOD OF PACKAGING ELECTRONIC COMPONENTS WITHOUT CREATING UNNECESSARY SOLDER BALLS

BACKGROUND OF THE INVENTION

1. Field of the Invention

The present invention relates to a method of packaging various types of electronic components on a printed circuit board (PCB) by means of soldering, and in particular, to a method of packaging electronic components on a PCB using a reflow soldering method.

2. Description of the Related Art

Soldering is conventionally employed as the method of packaging electronic components on a printed circuit board (PCB). Referring now to FIG. 1, one example of a method of packaging an electronic component using soldering is explained. Explanation is here presented taking as an example double-sided reflow in which electronic components are soldered onto both sides of a PCB by reflow.

Solder paste is first printed on lands that are provided on the PCB (Step 101). A summary of this printing process is shown in FIGS. 2A to 2C.

In this process, metal mask 13 is first arranged on PCB 15 as shown in FIG. 2A. Openings 12 of the same dimensions as lands 14 are formed in metal mask 13 in a pattern of arrangement that corresponds to the pattern of arrangement of lands 14 that are provided on the PCB. Metal mask 13 is then arranged such that openings 12 of metal mask 13 are each positioned on respective lands 14 of PCB 15.

Solder 11 is then rolled over metal mask 13 by means of printing squeegee 10, whereby solder 11 fills openings 12 of metal mask 13 as shown in FIG. 2B. After openings 12 are filled with solder 11, metal mask 13 is removed from PCB 15 as shown in FIG. 2C. Solder paste is thus printed on lands 14.

Chip components, for example, a surface-mount component such as a QFP (Quad Flat Package) or an SOP (Small Outline Package), are next placed on the printed solder paste (Step 102). The PCB with the mounted surface-mount component is then passed through a high-temperature reflow furnace, whereby the solder paste is melted and the leads of the surface-mount component and the lands of the PCB are soldered together (Step 103). The processes to this point complete the packaging on one surface of the PCB. The PCB is then turned over such that the surface on which a component has not yet been packaged is directed upward (Step 104).

Solder paste is then printed (Step 105) and a component is mounted (Step 106) as in Steps 101 and 102. Through-hole (T/H) components, which is a component constructed for mounting by passing leads into T/H that are formed in the PCB, is then mounted (Step 107). The PCB is next passed through a reflow furnace as in Step 103 to solder the components (Step 108). Finally, components that are unable to withstand the high temperature of the reflow furnace are soldered by manual operation (Step 109). The packaging of electronic components onto a PCB is thus completed.

In the above-described conventional method of packaging electronic components, a tin-lead (Sn—Pb) solder is typically used as solder 11. This tin-lead solder, however, contains the toxic heavy metal lead (Pb). The use of lead raises the problem of damage to the global environment that results from inappropriate disposal of used electronic equipment. As a solution to this problem, the use of lead-free solder that does not contain lead (Pb) has been preferred in recent years to prevent pollution of the environment.

Tin-silver (Ag) solder is well known as such a lead-free solder. Due to the stable characteristics of silver, the use of tin-silver solder in place of tin-lead solder for packaging electronic components enables packaging of electronic components that maintains the same level of reliability as in the prior art. However, the melting point of tin-silver solder is approximately 220° C., which is far higher than the approximately 183° C. melting point of tin-lead solder. For this reason, problems are encountered when tin-silver solder is simply substituted for tin-lead solder in packaging that was performed using tin-lead solder. Problems are also encountered when equipment that was used to carry out packaging with tin-lead solder is used without modification to carry out packaging while using tin-silver solder. In particular, when soldering by melting tin-silver solder having a melting point of 220° C. in a reflow furnace, electronic components may in some cases reach temperatures in excess of 240° C. The temperature endurance of a typical electronic component is approximately 230° C. Thus, when tin-silver solder is used to package electronic components, there arises the problem that the temperature endurance of the various electronic components that are used must be raised.

Besides tin-silver solder, which has a high melting point, tin-zinc (Sn—Zn) solder is also known as a lead-free solder. The melting point of this tin-zinc solder is approximately 197° C., and this tin-zinc solder can therefore be used to package electronic components of the prior art using the equipment of the prior art without modification.

A case is here considered in which, as the electronic component, a device having L-type leads such as a tantalum capacitor or a leadless chip component ranging in size from the 1608 size (0.8 mm×1.6 mm) to the 5750 size (5.7 mm×5 mm) is mounted on a PCB.

As described hereinabove, openings 12 of metal mask 13 usually have the same dimensions as lands 14. If, after using such a metal mask 13 to print solder paste on PCB 15, a device having L-type leads or a leadless chip having electrodes that occupy a relatively large region of lands 14 is mounted on PCB 15, a portion of solder 11 that has been printed on lands 14 is in some cases pressed out into an overflow region. A portion of solder 11 that has been pressed out from lands 14 in this way is absorbed by solder 11 on lands 14 in the reflow process, but a portion of this solder 11 may form solder balls in areas outside lands 14. If such solder balls are formed, they may cause breakdowns of PCB 15.

In particular, since the wettability of the above-described lead-free tin-zinc (Sn—Zn) solder is poorer than solder paste that contains lead (Pb), the use of this lead-free solder tends to result in the formation of the above-described solder balls. As a result, a countermeasure for preventing the occurrence of solder balls is all the more desirable when lead-free tin-zinc (Sn—Zn) solder is used.

SUMMARY OF THE INVENTION

It is an object of the present invention to provide a method a packaging an electronic component that can suppress the formation of solder ball in the reflow process.

To achieve this object, the present invention employs a metal mask in which at least one of the openings for printing solder paste is formed in a shape such that at least a part of edges of the opening are positioned inside the edges of the lands on the printed circuit board. Adopting this method allows a reduction of the solder that is pressed out from the lands when an electronic component is placed on the printed solder paste. Thus, according to the method of packaging an electronic component of the present invention, the formation of solder balls in the reflow process can be suppressed even when using solder having poor wettability.

In the method of packaging an electronic component of the present invention, making the edges of openings a shape that is positioned within the edges of the lands in areas on which electrodes are mounted can effectively reduce the protrusion of solder from the lands. Further, making the edges of the openings a shape that is positioned within the edges of the lands only in areas in which electrodes are placed does not greatly reduce the amount of solder paste that is printed on lands and therefore can maintain the soldering strength at an adequate level.

The present invention therefore enables effective packaging of electronic components even when using solder having poor wettability, and accordingly, can be applied as a method of packaging electronic components particularly when using tin-zinc solder that lacks lead (Pb) and has poor wettability. In addition, the present invention can be applied as a method of packaging a leadless chip or a device having L-type leads that tends to press solder from lands.

The above and other objects, features, and advantages of the present invention will become apparent from the following description with reference to the accompanying drawings, which illustrate examples of the present invention.

BRIEF DESCRIPTION OF THE DRAWINGS

FIG. 1 is a flow chart showing an example of a method of packaging an electronic component in which solder is used to package the electronic component.

FIG. 3 is a figure showing a sectional view of the package construction that is produced by the method of packaging an electronic component according to an embodiment of the present invention, along with a plan view of the land portions in which solder paste has been printed in the fabrication process of this package construction.

DETAILED DESCRIPTION OF THE PREFERRED EMBODIMENTS

Figure 2A:
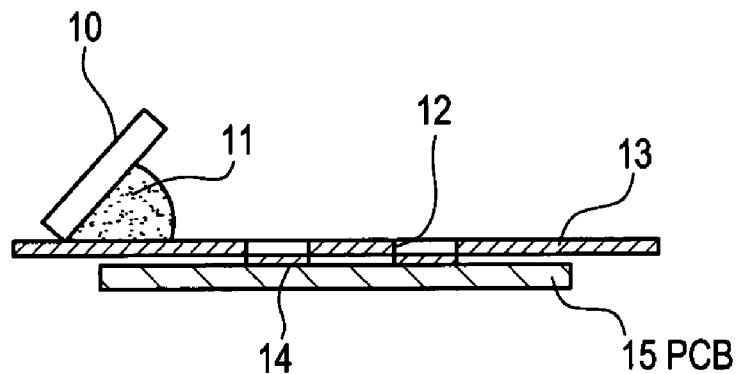
FIGS. 2A–2C are schematic views showing the processes of printing solder paste on lands that have been provided on a PCB.
Figure 2B:
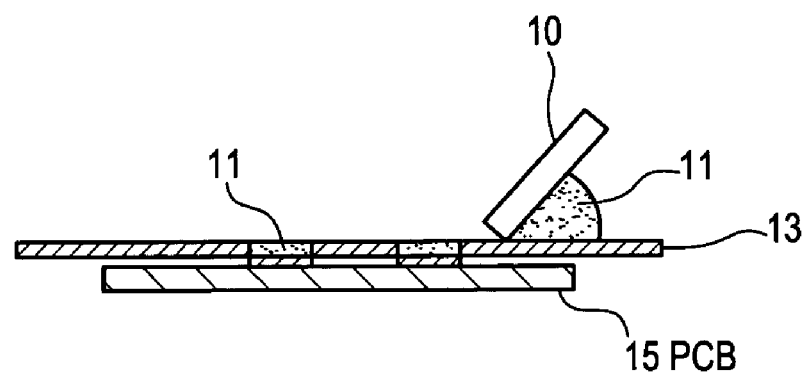
Figure 2C:
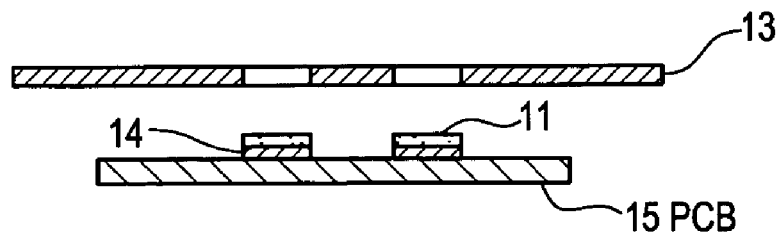

The method of packaging an electronic component according to an embodiment of the present invention is next explained with reference to the accompanying drawings.

Referring first to FIG. 3, in this embodiment, a leadless chip component is packaged on PCB 15 as electronic component 1. This electronic component 1 is provided with electrodes 2 on its sides, and electronic component 1 is packaged by soldering these electrodes 2 to lands 14 of PCB 15. PCB 15 is provided with lands 14 in a pattern of arrangement that corresponds to these electrodes 2. In the example shown in FIG. 3, lands 14 are rectangular in shape.

In the packaging process, a metal mask in which openings have been formed in a pattern of arrangement that corresponds to lands 14 is first used to print solder paste on PCB 15. In this case, a lead-free tin-zinc (Sn—Zn) solder is used as the solder paste.

As can be seen from the printed shape of solder 11 on lands 14 shown in FIG. 3, a metal mask is used in which the edges of the openings are positioned inside the edges of lands 14. In particular, the edges of the openings are positioned inside the edges of lands 14 in the areas close to electronic component 1 on lands 14 in which electrodes 2 of electronic component 1 are to be placed. In areas beyond electronic component 1, the edges of the openings and the edges of lands 14 coincide. Accordingly, the edge of an opening of the metal mask is a rectangular shape that overlies land 14 in the area outside electronic component 1, but in the area close to electronic component 1, is a triangular shape with an apex that protrudes toward electronic component 1, the entire shape of the opening thus forming a "home plate" shape.

Electronic component 1 is next mounted on PCB 15 on which solder 11 has been printed in this way, and this assembly is then passed through a reflow furnace to solder electronic component 1 onto PCB 15, whereby the packaged structure shown in FIG. 3 is obtained.

In the method of packaging an electronic component of the present embodiment that is described in the foregoing explanation, a metal mask is used in which the edges of openings 12 are positioned inside the edges of lands 14. Adopting this method enables a reduction of solder 11 that is pressed out of the regions of lands 14 when electronic component 1 is mounted. The method of packaging an electronic component of the present embodiment is therefore capable of suppressing the formation of solder balls in a subsequent reflow process even when using tin-zinc (Sn—Zn) solder having poor wettability.

Further, in the present embodiment, the edges of openings in the metal mask are positioned inside the edges of lands 14 only in areas in which electrodes 2 of electronic component 1 are placed. Positioning the edges of the openings of the metal mask inside the edges of lands 14 in the areas in which electrodes 2 of electronic component 1 are placed enables an effective reduction of the amount of solder paste that is pressed off lands 14 when electronic component 1 is mounted. Making the edges of the openings of the metal mask coincide with the edges of lands 14 in areas beyond electronic component 1 does not significantly reduce the total amount of solder paste. The method of packaging an electronic component of the present embodiment is therefore capable of suppressing the formation of solder balls in the reflow process while keeping the soldering strength sufficiently high even when using tin-zinc (Sn—Zn) solder having poor wettability.

Although an example has been described in which the openings of the metal mask are formed in a "home plate" shape in the method of packaging an electronic component according to this embodiment, the present invention is not limited to this form, and the shape of the openings of the metal mask may be any shape in which the edges of the openings of the metal mask are positioned inside the edges of the lands.

Further, although a case was described in the present embodiment in which, as electronic component 1, a leadless chip was mounted, this packaging method of an electronic component can be suitably applied to cases in which an electronic device having L-type leads such as a tantalum capacitor is mounted. In addition, although an example was described in which tin-zinc (Sn—Zn) solder was used as the solder paste in the method of packaging an electronic component according to the present embodiment, the present invention is not limited to this form and can be applied in cases in which other solder paste is used, the present invention being particularly effective when a solder paste having poor wettability is used.

While a preferred embodiment of the present invention has been described using specific terms, such description is for illustrative purposes only, and it is to be understood that changes and variations may be made without departing from the spirit or scope of the following claims.

What is claimed is:

1. A method of manufacturing a package including an electronic component, in which the electronic component has electrodes and is packaged on a printed circuit board in which lands having border edges have been formed in a pattern of arrangement that corresponds to said electrodes by soldering said electrodes to said lands; said method comprising steps of:

arranging a metal mask, in which openings are formed in a pattern corresponding to said lands, on said printed circuit board such that said openings are each positioned over respective said lands, said opening defined by edge regions surrounding said openings;

filling each of said openings with solder paste;

removing said metal mask;

placing said electronic component on said printed circuit board such that said electrodes are each placed on said solder paste; and performing reflow of said solder paste to solder said electrodes to said lands;

wherein at least one of said openings of said metal mask is formed in a shape such that portions of said edge regions have straight edges and at least a part of said edge regions are positioned inside the border edges of said lands when said metal mask is arranged on said printed circuit board; and wherein said edge regions of said at least one of said openings is in the shape of a five sided polygon forming a home plate-shape having a convex shape with a vertex facing toward said electronic component, said vertex positioned not inside the border edges of the lands; and wherein said filling step fills said at least one opening with said solder paste comprises tin-zinc (Sn—Zn) solder that does not contain lead (Pb).

2. The method of manufacturing a package including an electronic component according to claim 1, wherein said at least a part of said edge regions are positioned inside the border edges of said land in areas on said land in which said electrodes are placed.

3. The method of manufacturing a package including an electronic component according to claim 1, wherein said electronic component is a leadless chip.

4. The method of manufacturing a package including an electronic component according to claim 1, wherein said electronic component is a device having L-type leads.

* * * * *